United States Patent
Hara

(10) Patent No.: US 7,158,209 B2
(45) Date of Patent: *Jan. 2, 2007

(54) HOLDING MECHANISM IN EXPOSURE APPARATUS, AND DEVICE MANUFACTURING METHOD

(75) Inventor: Shinichi Hara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/360,496

(22) Filed: Feb. 24, 2006

(65) Prior Publication Data

US 2006/0139584 A1 Jun. 29, 2006

Related U.S. Application Data

(63) Continuation of application No. 10/778,744, filed on Feb. 13, 2004, now Pat. No. 7,068,348.

(30) Foreign Application Priority Data

Feb. 13, 2003 (JP) ............... 2003-035267

(51) Int. Cl.
G03B 27/52 (2006.01)
G03B 27/42 (2006.01)
G02B 7/02 (2006.01)

(52) U.S. Cl. ............... 355/30; 355/53; 359/820

(58) Field of Classification Search ............... 355/30, 355/53, 72–76; 359/811–820
See application file for complete search history.

(56) References Cited

U.S. PATENT DOCUMENTS

| | | | | |
|---|---|---|---|---|
| 4,267,523 A * | 5/1981 | Brown | ............... | 372/33 |
| 5,390,228 A * | 2/1995 | Niibe et al. | ............... | 378/34 |
| 6,118,599 A * | 9/2000 | Spinali | ............... | 359/820 |
| 6,867,848 B1 * | 3/2005 | Ebinuma et al. | ............... | 355/75 |
| 7,068,348 B1 * | 6/2006 | Hara | ............... | 355/30 |
| 2003/0035088 A1 * | 2/2003 | Emoto | ............... | 355/53 |

FOREIGN PATENT DOCUMENTS

JP 7-153663 6/1995

* cited by examiner

*Primary Examiner*—Henry Hung Nguyen
(74) *Attorney, Agent, or Firm*—Morgan & Finnegan, LLP

(57) ABSTRACT

Disclosed is a holding system and an exposure apparatus having the same, wherein deformation of an optical member resulting from its thermal expansion and causing degradation of imaging performance can be reduced to assure desired imaging performance. The holding system for holding an optical member includes a barrel for at least partially surrounding the optical member and/or a heat source, an average of radiation coefficient of an inside surface of the barrel is not less than 0.8.

12 Claims, 4 Drawing Sheets

HOLDING MECHANISM IN EXPOSURE APPARATUS, AND DEVICE MANUFACTURING METHOD

This application is a continuation application of U.S. application Ser. No. 10/778,744, filed Feb. 13, 2004 which is now U.S. Pat. No. 7,068,348 and entitled "Holding Mechanism in Exposure Apparatus, And Device Manufacturing Method." Aforementioned U.S. application Ser. No. 10/778,744, filed Feb. 13, 2004, is hereby incorporated by reference herein in its entirety.

This application claims the right of priority under 35 U.S.C. § 119 to Japanese Application Number 2003-035267 filed Feb. 13, 2003, in Japan.

FIELD OF THE INVENTION AND RELATED ART

This invention relates generally to an optical member holding mechanism. More particularly, the invention concerns a cooling system for cooling an optical element used in an exposure apparatus that is arranged to expose a workpiece such as a monocrystal substrate for a semiconductor wafer, a glass substrate for liquid crystal display (LCD) and so on. The present invention is particularly suitable to a cooling system for cooling an optical element in an exposure apparatus that uses ultraviolet rays or extreme ultraviolet rays (EUV) as an exposure light source.

Manufacture of fine semiconductor devices such as semiconductor memories or logic circuits based on photolithography (printing) technology uses a reduction projection exposure apparatus for projecting a circuit pattern formed on a reticle or mask (these terms being used alternately in this specification), onto a wafer through a projection optical system thereby to transfer the pattern onto the wafer.

The minimum size (resolution) that can be transferred by a reduction projection exposure apparatus is proportional to the wavelength of light used in the lithographic exposure, and it is in inverse proportion to the numerical aperture (NA) of the projection optical system. Thus, with the shorter wavelength, the better the resolution is. In consideration of it and in order to meet recent requirement to further miniaturization of semiconductor devices, the wavelength of exposure light has been shortened more and more. The wavelength of used ultraviolet light has been shortened, from ultra-high pressure Hg lamp (i-line having a wavelength of about 365 nm) to KrF excimer laser (wavelength is about 248 nm) and ArF excimer laser (wavelength is about 193 nm).

However, the size of semiconductor devices has been reduced drastically, and there is a limitation in the lithographic technology based on ultraviolet light. In consideration of this, a reduction projection exposure apparatus that uses extreme ultraviolet (EUV) light of a wavelength of an order of 10 to 15 nm, much shorter than the ultraviolet light, has been developed to accomplish efficient transfer of a vary narrow circuit pattern of a linewidth narrower than 0.1 micron. Hereinafter, this type of exposure apparatus will be referred to as "EUV exposure apparatus".

With shortened wavelength of exposure light, absorption of light by substance becomes very large. Therefore, it becomes difficult to use a dioptric element (lens) based on refraction of light, as used with visible light or ultraviolet light. In the wavelength region of EUV light, there is no glass material that can be used therewith. Thus, a catoptric system wherein an optical system is constituted only by reflection elements such as mirrors (e.g. multilayered mirrors), is used.

A mirror does not reflect all the exposure light, but it absorbs 30% or more of the exposure light. The absorbed exposure light produces heat that causes deformation of the mirror surface shape and degradation of the optical performance (particularly, imaging performance). In consideration of it, generally mirrors are made of low thermal-expansion glass material having small linear expansion coefficient such as 10 ppb, to make small a change in mirror shape due to temperature variation.

The EUV exposure apparatuses are used for exposure of a circuit pattern of a linewidth of 0.1 micron or less, and the linewidth precision is very strict. Regarding the mirror surface shape, deformation of only 0.1 nm order will be tolerable. Even if the liner expansion coefficient of the mirror is 10 ppb, the temperature will rise gradually due to absorption of exposure light and the mirror surface shape will change accordingly. If, for example, the mirror has a thickness 50 mm, a temperature rise of 0.2° C. will cause a change 0.1 nm in the mirror surface shape. In consideration of this, use of a Peltier device for radiation cooling of a mirror has been proposed.

As regards the Peltier device, however, the temperature at the heat radiating side is high. Even if it is cooled by a heat radiating block through which a cooling medium flows, where the flow rate of the cooling medium is small or a gas is used as the cooling medium, the temperature of the heat radiating block will be higher than the mirror temperature.

If the temperature of the heat radiating block is raised, it becomes a source of thermal external disturbance. Thus, radiation heat emitted from it will be reflected by inside surfaces of a barrel, supporting the mirror, to warm the mirror. It will not be sufficiently cooled by the radiation cooling capacity, and thermal deformation will be caused, resulting in degradation of the exposure aberration.

It is accordingly an object of the present invention to provide a holding system and an exposure apparatus having the same, by which deformation of an optical member due to its thermal expansion that causes degradation of the imaging performance can be reduced significantly to assure desired optical performance.

In accordance with an aspect of the present invention, there is provided a holding system for holding an optical member placed in a substantially vacuum ambience, comprising: a barrel for at least partially surrounding the optical member and/or a heat source, wherein an average of radiation coefficient of an inside surface of the barrel is not less than 0.8.

In one preferred form of this aspect of the present invention, the average of radiation coefficient of the inside surface of the barrel is not less than 0.9.

Said barrel may be made of ceramics or low thermal-expansion alloy material.

The holding system may further comprise a cooling mechanism for cooling the optical member.

Said cooling mechanism may include a radiation member for cooling the optical member without contact thereto, a Peltier device disposed in contact with said radiation member, and a heat radiating block disposed at a side of said Peltier device remote from said radiation member.

An average of radiation coefficient of said heat radiating block may be not greater than 0.2.

In accordance with another aspect of the present invention, there is provided an exposure apparatus, comprising: an optical system having a plurality of optical elements, for directing light from a light source to a member to be exposed; and a holding system as recited in above, for holding at least one of said plurality of optical elements.

In accordance with a further aspect of the present invention, there is provided a device manufacturing method, comprising the steps of: exposing a workpiece by projection exposure, by use of an exposure apparatus as recited above; and developing the exposed workpiece.

In accordance with a still further aspect of the present invention, there is provided a holding system for holding an optical member disposed in a substantially vacuum ambience, comprising: a cooling mechanism for cooling the optical member and/or a heat source without contact thereto, wherein said cooling mechanism includes (i) a radiation member disposed opposed to the optical member and/or the heat source without contact thereto, (ii) a Peltier device being in contact, at an end, with the radiation member, for adjusting a temperature of said radiation member, and (iii) a heat radiating block being in contact with the other end of said Peltier device, wherein an average of radiation coefficient of said heat radiating block is not greater than 0.2.

In one preferred form of this aspect of the present invention, the average of radiation coefficient of said heat radiating block may be not greater than 0.1.

In accordance with a yet further aspect of the present invention, there is provided an exposure apparatus, comprising: an optical system having a plurality of optical elements, for directing light from a light source to a member to be exposed; and a holding system as recited in above, for holding at least one of said plurality of optical elements.

In accordance with a still further aspect of the present invention, there is provided a device manufacturing method, comprising the steps of: exposing a workpiece by projection exposure, by use of an exposure apparatus as recited in above; and developing the exposed workpiece.

In accordance with another aspect of the present invention, there is provided an exposure apparatus, comprising: an optical system including a plurality of optical elements, for directing light from a light source to a member to be exposed; a barrel for at least partially surrounding the plurality of optical elements; and a cooling mechanism for cooling at least one of the plurality of optical elements, wherein said cooling mechanism includes (i) a radiation member disposed opposed to the optical member and/or the heat source without contact thereto, (ii) a Peltier device being in contact, at an end, with the radiation member, for adjusting a temperature of said radiation member, and (iii) a heat radiating block being in contact with the other end of said Peltier device, wherein an average of radiation coefficient of an inside surface of the barrel is not less than 0.8, and wherein an average of radiation coefficient of the heat radiating block is not greater than 0.2.

In one preferred form of this aspect of the present invention, the average of radiation coefficient of the inside surface of the barrel may be not less than 0.9.

The average of radiation coefficient of the heat radiating block may be not greater than 0.1.

In accordance with a still further aspect of the present invention, there is provided a device manufacturing method, comprising the steps of: exposing a workpiece by projection exposure, by use of an exposure apparatus as recited above; and developing the exposed workpiece.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a flow chart for explaining a procedure for manufacturing microdevices such as semiconductor chips (IC or LSI), LCD, CCD and so on.

DESCRIPTION OF THE PREFERRED EMBODIMENTS

Figure 1:
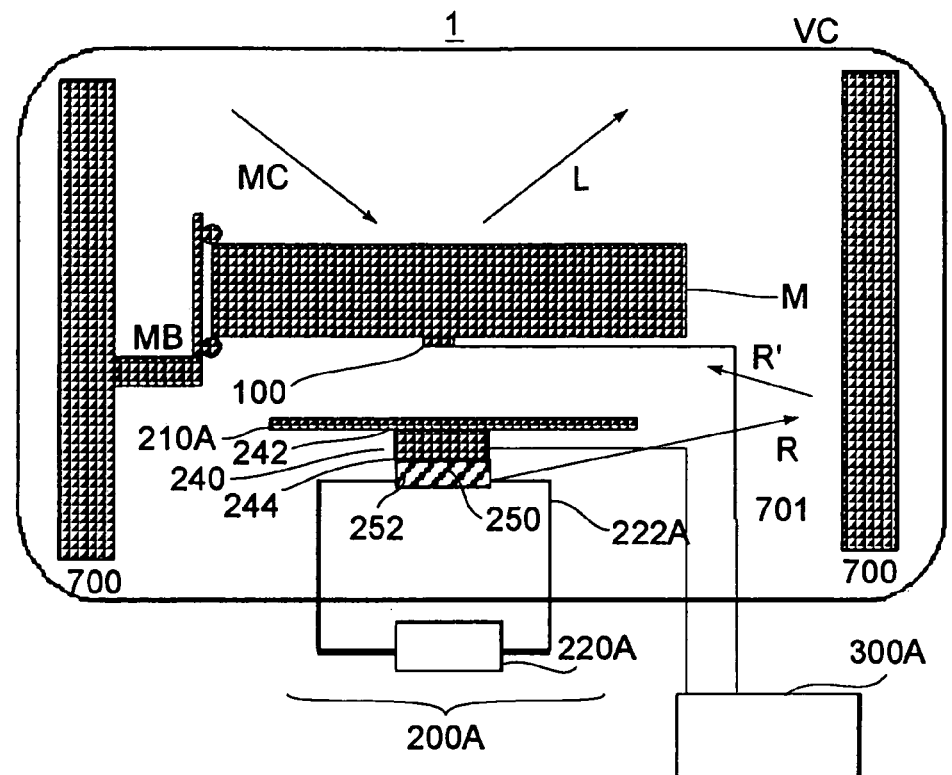
FIG. 1 is a schematic view of a holding system according to an embodiment of the present invention.

Preferred embodiments of the present invention will now be described with reference to the attached drawings. In these drawings, the same reference numerals are assigned to corresponding components, and duplicate description will be omitted.

FIG. 1 is a schematic view for illustrating a general structure of a holding system 1 according to an embodiment of the present invention.

The holding system 1 holds an optical member M placed inside a vacuum chamber VC. The vacuum chamber VC is evacuated by an unshown vacuum pump to a vacuum of about $1 \times 10^{-6}$ [Pa] so as to reduce deposition of contamination on the surface of the optical member M due to reaction between exposure light L and residual gas components therein, to prevent a decrease of reflectivity.

Inside the vacuum chamber VC, the optical member M is supported by a barrel 700, and it is positioned at a predetermined site through a supporting member MB and by means of a clamp member MC, so that it functions to image the light on the basis of reflection, refraction and diffraction, for example. The optical member M may include, for example, mirror, lens, parallel plane glass, prism, and diffractive optical element such as Fresnel zone plate, kinoform, binary optics and hologram. This embodiment will be explained as an example where the optical member M is a mirror.

As best seen in FIG. 1, the holding system 1 comprises a barrel 700 for partially surrounding the mirror, a member MB for supporting the mirror at the barrel, a mechanism MC for clamping the mirror, and a cooling mechanism for controllably cooling the mirror in a predetermined temperature range. The cooling mechanism includes a temperature detecting unit 100, a radiation cooling mechanism 200A, and a control means 300A. In this drawing, as characteristic feature, only one mirror is partially surrounded.

The mirror clamp mechanism MC has a structure for clamping a mirror at three points, on the basis of pneumatic actuator such as air cylinder, for example.

The member MB for supporting the mirror at the barrel serves to confine the position of the mirror supported at three points by the clamping mechanism MC, without excessive confinement to six freedoms, by means of a kinematic mount such as disclosed in a mask holding method proposed by Japanese Laid-Open Patent Application No. H7-153663, such that the mirror is held at a predetermined position.

The radiation cooling mechanism 200A is disposed at a position opposed to the optical member M (at a side remote from the light entrance side where exposure light L is incident), without contact thereto. It functions to absorb heat from the optical member M, on the basis of radiation. The radiation cooling mechanism 200A includes a radiation plate 210A, a Peltier device 240, a heat radiating block 250, and a circulation means 220A.

The radiation plate 210A joins the Peltier device 240 (to be described later). Due to the Peltier effect of the Peltier device 240, the radiation plate 210A is cooled so that a temperature difference is produced between it and the optical member M. Thus, by radiation, the heat of the optical member M is absorbed.

As regards the Peltier device 240, by changing the electric current flowing through the Peltier device, the temperature difference between the heat absorbing surface 242 and the heat radiating surface 244 can be changed. By holding the heat radiating surface 244 approximately at a constant temperature with the use of heat radiating block (to be described later), the temperature of the heat absorbing surface is lowered. Thus, by joining the heat absorbing surface 242 of the Peltier device 240 to the radiation plate 210A, heat can be absorbed from the radiation plate 210A and the plate 210A can be cooled thereby. Since the Peltier device 210A has a good response, the temperature of the radiation plate 210A can be controlled very precisely to thereby maintain the temperature of the optical member M at a predetermined level.

The heat radiating block 250 is joined to the heat radiating surface 244 of the Peltier device 240, and it has a flowpassage 252 through which a cooling medium supplied from circulation means 220A (to be described later) flows. The flowpassage 252 is connected to the circulation means 220A through a pipe 222A. The flowpassage 252 is formed within the heat radiating block 250, and it is so structured that a cooling medium flows uniformly along the whole surface of the heat radiating block 250. While being cooled by the cooling medium, the heat radiating block 250 functions to collect heat discharged from the heat radiating surface 244 of the Peltier device 240.

The circulation means 220A is connected to the pipe 222A, and it supplies and circulates a cooling medium through the pipe 222A and the flowpassage 252 of the heat radiating block 250. The cooling medium supplied and circulated by the circulation means 220A through the flowpassage 252 functions to collect heat from the heat radiating block 250.

The controller means 300A controls the radiation cooling mechanism 200A so that the temperature of the optical member M as detected by the detecting means 100 is brought to and maintained at a predetermined level. The controller means 300A controls the temperature of the radiation plate 210A by changing an applied voltage to be applied to the Peltier device 240.

Where a lower delivery-pressure type circulation means 220A is used for reduction of cost and space, due to the pressure loss of the pipe 222A, the flow rate will decrease and the temperature of the heat radiating block will become higher than the mirror temperature. The same applies to a case where a gaseous cooling medium having a lower cooling capacity is used to prevent leakage of fluid into the vacuum chamber VC.

The inside 701 of the barrel may desirably have a radiation coefficient of not less than 0.8, preferably, not less than 0.9. In that occasion, 80% or more of radiation heat R from a high-temperature portion such as the heat radiating block 250, for example, can be absorbed, such that radiation heat R' reflected by the inside wall 701 of the barrel can be reduced. As a result, thermal deformation of the mirror due to the radiation heat and degradation of exposure aberration attributable to such thermal deformation can be reduced effectively. In order to reduce the radiation heat R from a high-temperature portion such as the heat radiating block 150 as much as possible, the material of the heat radiating block may be metal and, additionally, the surface thereof may be polished to provide a radiation coefficient not greater than 0.2, more preferably, not more than 0.1.

If the radiation coefficient is still less than 0.8 only with the material of the barrel, a radiation efficiency of 0.8 or more can be attained by applying a material having high radiation coefficient such as oxides (e.g. $SiO_2$) or graphite, for example, to the inside surface of the barrel in accordance with conventional film forming technology. The absorbed heat quantity of the exposure heat by the mirror of the projection optical system is about 1 W, and the Peltier device cooling capacity is set to a corresponding level. This is because, even if the Peltier device cooling capacity is set excessively high as compared with the required level, the temperature at the heat discharging side rises largely yet the temperature decrease of the radiation plate side is small, such that the radiation heat R increases consequently. Even where the radiation heat R is suppressed to 1 W, the heat reflected by the inside wall of the barrel, that is, R', namely, (1−"radiation coefficient")×R, is absorbed by the mirror. By providing a radiation coefficient of 0.8 or more at the inside surface of the barrel, the heat quantity which may cause external disturbance to the mirror can be reduced to 0.2 W or lower.

As regards the heat source, in this embodiment, the heat radiating block of the Peltier device is taken as a source, as an example. However, heat generation from an actuator of a mirror position adjusting mechanism (not shown) may be taken as the heat source.

The barrel 700 is made of a material having a linear expansion coefficient of not greater than 1 ppm. With this structure, the amount of thermal deformation of the barrel due to a temperature rise of the barrel, resulting from absorption of radiation heat R from the barrel inside, can be reduced. Since the amount of thermal deformation of the barrel decreases, a change in position of the mirror due to the optical member supporting member MB and clamping member MC can also be reduced. Even if the radiation heat R is suppressed to 1 W level as described, since the surface area of the barrel is of an order of 1 $m^2$, in a balanced state of radiation, the temperature of the barrel rises by about 0.1° C. The barrel has a length of about 1 m and, therefore, where a material of 1 ppm or lower is used, changes in the distance to the mirror can be suppressed to 100 nm or smaller.

Generally, a mirror support is provided with a fine-motion mechanism for active correction of shift of the mirror position due to vibration. Since the shift of the mirror position due to the temperature rise of the barrel is suppressed to a small level as described hereinbefore, it can be corrected by the stroke of the fine-motion mechanism. Thus, a change in position of the mirror resulting from the temperature rise of the barrel can be corrected by the fine-motion mechanism.

The low thermal-expansion material may be ceramics or a low thermal-expansion alloy (called invar) of ion, nickel and cobalt. These materials have a high rigidity of Young's modulus 100 Gpa or more. As compared with low thermal expansion glass material, vibration amplitude of the barrel itself due to external vibration is small, such that vibration of the optical member can be reduced.

Figure 2:
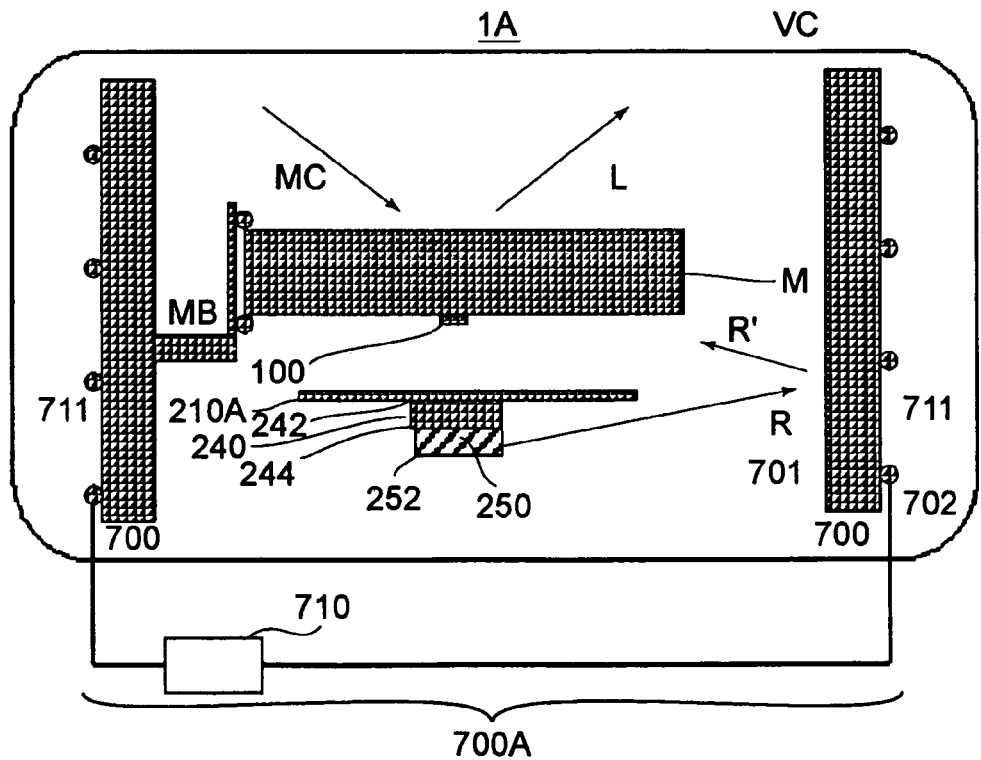
FIG. 2 is a schematic view of a holding system according to another embodiment of the present invention.

Referring to FIG. 2, another embodiment of holding system IA, corresponding to a modification of the holding system 1, will be explained. The holding system 1A differs from the holding system 1 in the point of barrel cooling mechanism 700A. Here, FIG. 2 is a schematic view of a general structure of a holding system IA, corresponding to a modification of the holding system 1. Regarding FIG. 2, description for those components having been explained with reference to FIG. 1 will be omitted.

A cooling pipe 711 is a metal pile joined to a barrel 700, and it circulates a cooling medium of constant temperature by means of a cooling medium circulation system 710. Reason for use of a metal pipe is as follows. If a resin tube is used, there is a possibility that the cooling medium permeates through the tube and is vaporized. Such a gas reacts with exposure light to change the property of the mirror surface or to produce deposition on the mirror surface. This causes a decrease of mirror reflectivity and a decrease of exposure light intensity, which results in decreased throughput. Use of a metal pipe is to avoid these inconveniences. Here, in order to maintain a constant temperature at a high precision without applying external disturbance to the temperature control of the optical member M, the temperature of the cooling medium should desirably be set to be equal to the predetermined temperature of the optical member M described hereinbefore.

Figure 3:
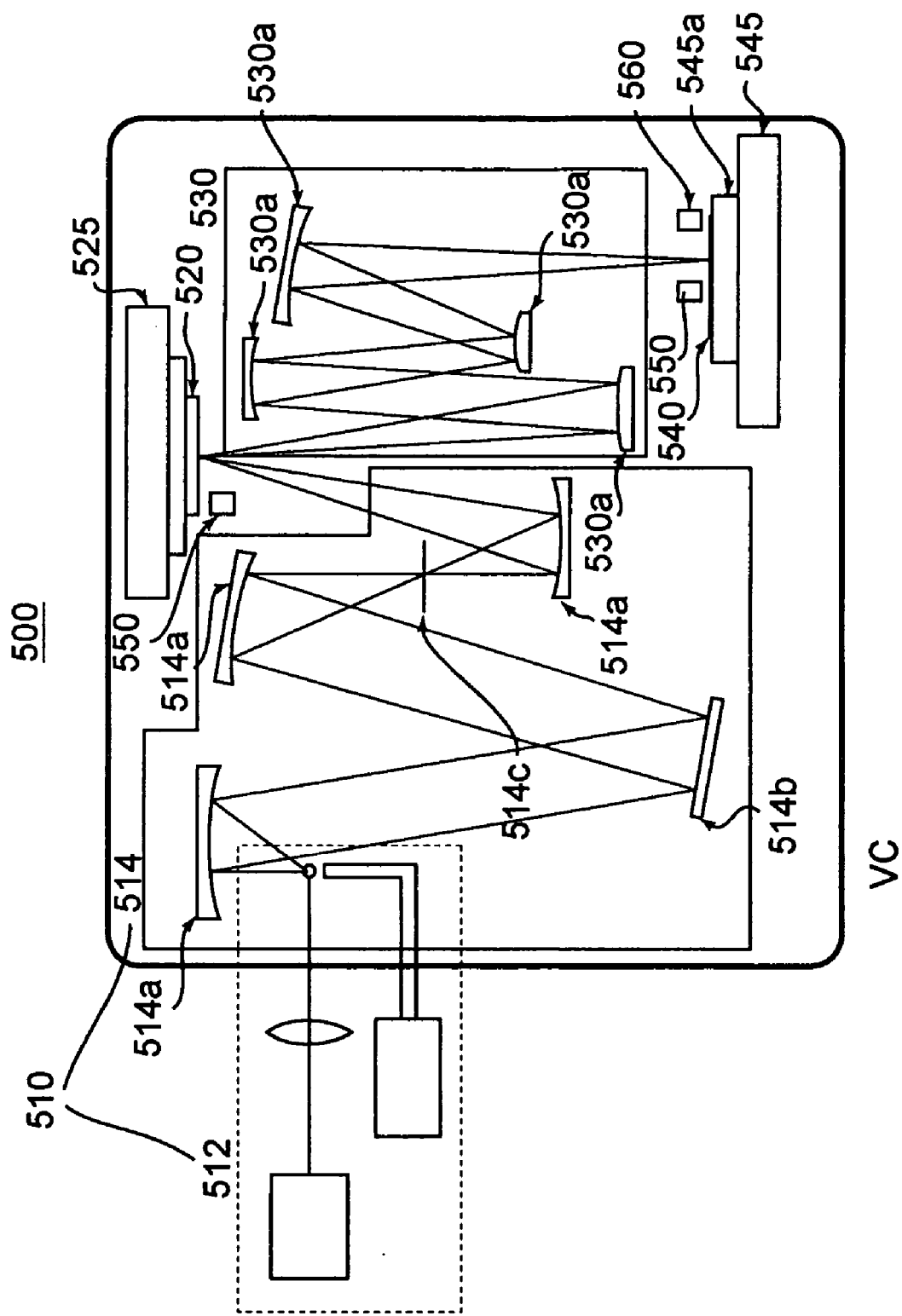
FIG. 3 is a schematic view of a general structure of an exposure apparatus according to an embodiment of the present invention.

Referring now to FIG. 3, an embodiment of exposure apparatus 500 into which a cooling system 100 of the present invention is incorporated, will be described. FIG. 3 is a schematic view of a general structure of the exposure apparatus 500.

The exposure apparatus 500 is a projection exposure apparatus wherein EUV light (e.g. wavelength 13.4 nm) is used as illumination light for exposure, and a circuit pattern formed on a mask 520 is projected and lithographically transferred to a workpiece 540 to be exposed, in accordance with a step-and scan method or step-and-repeat method, for example. This type of exposure apparatus is particularly usable to lithographic process for submicron or quarter-micron order. In this embodiment, description will be made to an example of step-and-scan type exposure apparatus, called a scanner. Here, the step-and-scan method is an exposure method in which a wafer is continuously scanned (scanningly moved) relative to a mask so that a mask pattern is lithographically transferred to the wafer while, on the other hand, after completion of the exposure of one shot, the wafer is moved stepwise for exposure of a subsequent exposure region. On the other hand, the step-and-repeat method is an exposure method in which the exposure of one shot described above is carried out at once.

Referring to FIG. 3, the exposure apparatus 500 comprises an illumination system 510, a mask 520, a mask stage 525 for carrying the mask 520 thereon, a projection optical system 530, a workpiece 540 to be exposed, a wafer stage 545 for carrying the workpiece 540 thereon, an alignment detecting mechanism 550, and a focus position detecting mechanism 560.

As shown in FIG. 3, since EUV light has low transmissivity to atmosphere and contamination is easily produced by reaction with residual gas component such as high-molecular organic gas, for example, at least the light path along which the EUV light passes (that is, the whole optical system) is filled with a vacuum ambience VC.

The illumination system 510 is arranged to illuminate a mask 520 with EUV light (e.g. wavelength 13.4 nm) of arcuate shape defined with respect to an arcuate view field of the projection optical system 530. It includes an EUV light source 512 and an illumination optical system 514.

The EUV light source 412 comprises a laser plasma light source, for example. In the laser plasma light source, pulsed laser light of large intensity is projected on a target material placed inside a vacuum container, whereby a high-temperature plasma is produced. EUV light of a wavelength of 13 nm order, for example, emitted from the plasma is used. As regards the target material, metal film, gas jet or liquid drops may be used. In order to improve the average intensity of emitted EUV light, the repetition frequency of the pulse laser should be high, and generally, the laser is operated at a repetition frequency of a few KHz.

The illumination optical system 514 comprises a condensing mirror 514a and an optical integrator 514b. The condensing mirror 514a serves to collect EUV light being approximately isotropically emitted from the laser plasma. The optical integrator 514b has a function for illuminating the mask 520 uniformly with a predetermined numerical aperture. Also, the illumination optical system 514 includes an aperture 514c disposed at a position optically conjugate with the mask 520, for restricting the illumination region on the mask into an arcuate shape. The holding system 1 of the present invention can be applied to the condensing mirror 514a and the optical integrator 514b which are optical members constituting the illumination optical system 514 and, in that occasion, deformation due to thermal expansion of the mirror can be prevented and superior imaging performance can be assured.

The mask 520 is a reflection type mask, and it has a circuit pattern (or image) formed thereon which pattern is going to be transferred. The mask is supported on and moved by a mask stage. Diffraction light produced from the mask 520 as illuminated is reflected by the projection optical system 530, and is projected on the workpiece 540 to be exposed. The mask 520 and the workpiece 540 are disposed in an optically conjugate relationship with each other. The exposure apparatus 500 in this embodiment is a step-and-scan type exposure apparatus, and by scanning the mask 520 and the workpiece 540, the pattern of the mask 520 is projected and transferred onto the workpiece 540 in a reduced scale.

The mask stage 525 supports the mask 520, and it is connected to a moving mechanism (not shown). Any structure well-known in the art may be applied to the mask stage 525. The moving mechanism not shown in the drawing comprises a linear motor, for example, and it drives the mask stage 525 thereby to move the mask 520. The exposure apparatus 500 operates to scan the mask 520 and the workpiece 540 in synchronism with each other.

The projection optical system 530 includes a plurality of reflection mirrors (multilayered-film mirrors) 530a to project a pattern formed on the mask 520 surface onto the workpiece 540 (image plane) in a reduced scale. The number of mirrors 530a may be four to eight, and preferably, six or eight. In order to obtain a wide exposure region with a smaller number of mirrors, only a narrow arcuate region (ring field) spaced from the optical axis by a certain distance, may be used, while the mask 520 and the workpiece 540 are scanned simultaneously. This enables transfer of a wide area.

The numerical aperture (NA) of the projection optical system is about 0.2 to 0.3. The holding system 1 of the present invention can be applied to the mirrors 530a which are optical members constituting the projection optical system 530 and, in that occasion, deformation due to thermal expansion of the mirror can be prevented and superior imaging performance can be assured.

The mirrors of the projection optical system and the illumination optical systems are supported by the barrel 700 that partially surrounds the mirrors.

The workpiece 540 is a wafer, in this embodiment. However, it may be a liquid crystal base substrate or any other members to be processed. The workpiece 540 has a photoresist applied thereto.

The wafer stage 545 has a wafer chuck 545a to support the workpiece 540. The wafer stage 545 moves the workpiece by use of a linear motor, for example. The mask 520 and the workpiece 540 are scanned (moved) in synchronism with each other. Also, the position of the mask stage 535 and the position of the wafer stage 545 are monitored by means of a laser interferometer, for example, and they are driven at a constant speed ratio.

The alignment detecting mechanism 550 has a function for measuring the positional relation between the mask 520 position and the optical axis of the projection optical system 530, as well as the positional relation between the workpiece 540 position and the optical axis of the projection optical system 530. Also, it functions to set the positions and angles of the mask stage 525 and the wafer stage 545 so that a projected image of the mask 520 is registered with a predetermined position of the workpiece 540.

The focus position detecting mechanism 560 measures the focus position upon the workpiece 540 surface, and it controls the position and angle of the wafer stage 545 thereby to continuously hold the workpiece 540 surface at the imaging position of the projection optical system 530.

In exposure operation, the EUV light produced by the illumination device 510 illuminates the mask 520, and the pattern provided on the mask 520 surface is imaged upon the workpiece 540 surface. In this embodiment, the image plane has an arcuate shape (ring-like shape) and, by scanning the mask 520 and the workpiece 540 at a speed ratio corresponding to the reduction magnification ratio, the whole surface of the mask 520 is exposed.

Next, referring to FIGS. 4 and 5, an embodiment of a device manufacturing method which uses an exposure apparatus 500 described above, will be explained.

Figure 4:
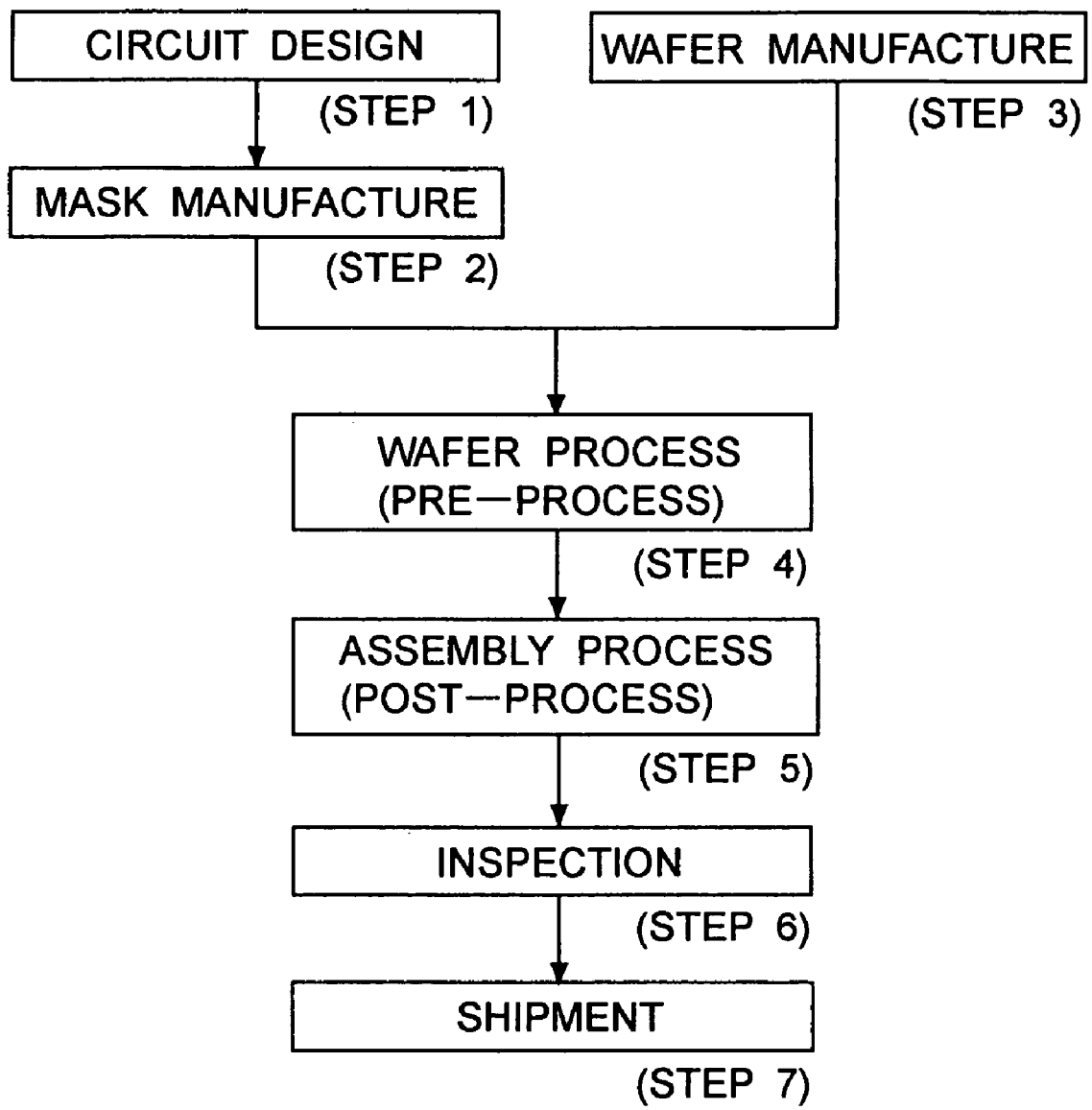

FIG. 4 is a flow chart for explaining the procedure of manufacturing various microdevices such as semiconductor chips (e.g., ICs or LSIs), liquid crystal panels, or CCDs, for example. In this embodiment, description will be made to an example of semiconductor chip production. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 5:
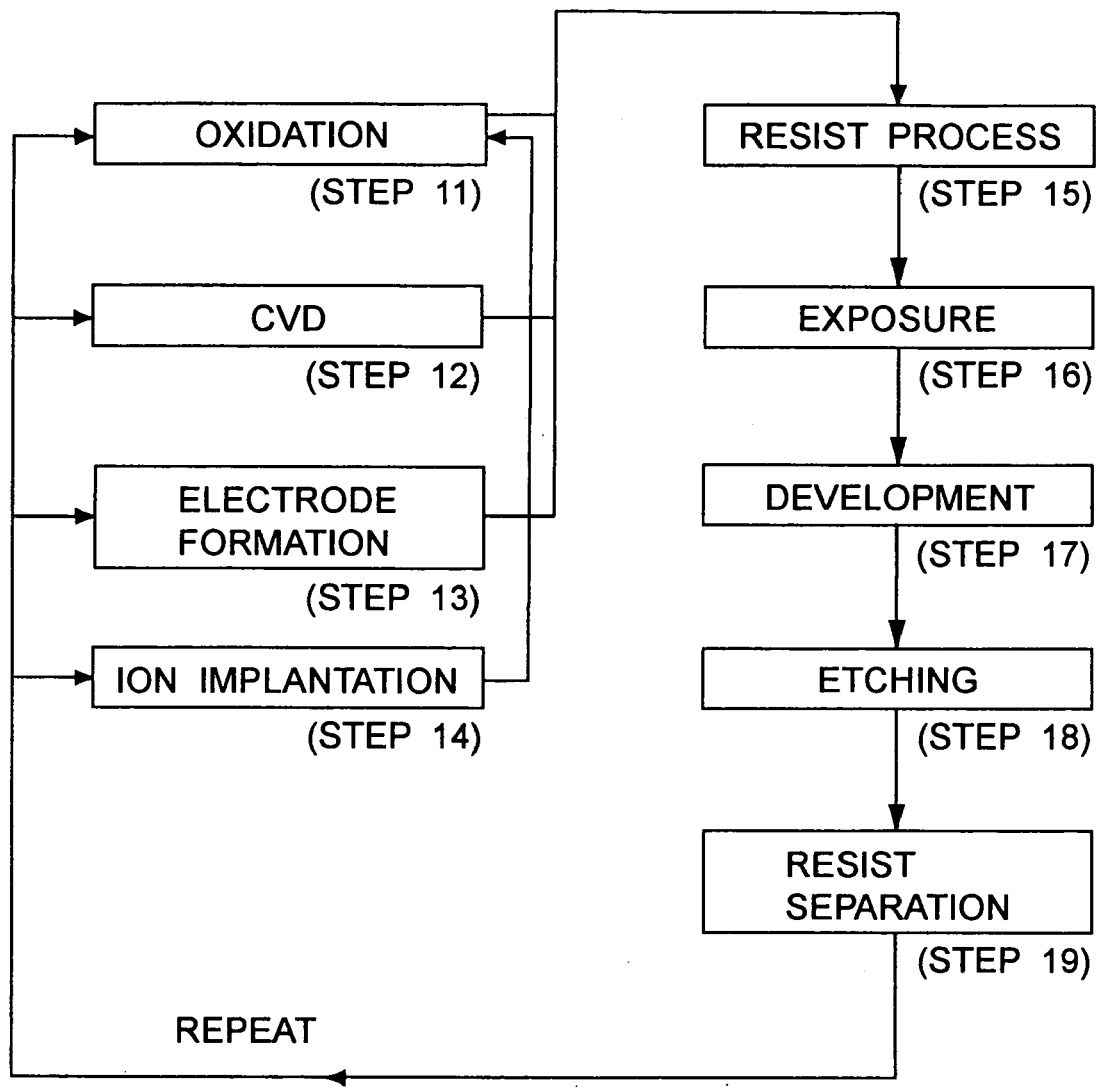
FIG. 5 is a flow chart for explaining details of a wafer process at step 4 in the procedure of FIG. 4.

FIG. 5 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high-quality microdevices can be manufactured.

As described, a device manufacturing method that uses an exposure apparatus as well as a device as a product thereof are also in the scope of the present invention.

The foregoing description has been made to cases wherein a heat generation source is present inside a barrel. However, the invention is applicable also to a case wherein an object other than a radiation plate and having a temperature lower than the mirror temperature is included, that is, a case wherein something that may cause external disturbance to the mirror temperature control due to heat absorption source. Further, as a matter of course, the invention is not limited to the disclosed embodiments. Many changes and various modifications are possible within the scope of the invention.

In accordance with the embodiments of the present invention as described above, even for an optical member placed in a vacuum ambience, thermal deformation of the optical member that may cause degradation of the imaging performance can be reduced to accomplish desired optical performance. Further, deformation of an optical member resulting from deformation of the support means can be reduced, whereby desired optical performance can be accomplished. Furthermore, vibration of an optical member can be reduced, and desired optical performance can be accomplished.

In accordance with the embodiments of the present invention described hereinbefore, thermal deformation of a barrel itself is small, and deformation of an optical member can be reduced, whereby desired optical performance can be accomplished. Additionally, external disturbance of heat toward the outside the barrel and thermal deformation of any other precision positioning member can be reduced effectively. Furthermore, the present invention can provide an exposure apparatus by which a narrower linewidth can be transferred at better precision, and by which higher quality devices can be produced.

While the invention has been described with reference to the structures disclosed herein, it is not confined to the details set forth and this application is intended to cover such modifications or changes as may come within the purposes of the improvements or the scope of the following claims.

What is claimed is:

1. A holding system for holding an optical member placed in a substantially vacuum ambience, comprising:
    a barrel for at least partially surrounding the optical member; and
    a film formed on an inside surface of said barrel and including a material having a radiation coefficient larger than that of a material of said barrel;
    wherein an average of radiation coefficient of the inside surface of said barrel is not less than 0.8.

2. A holding system according to claim 1, wherein the average of radiation coefficient of the inside surface of the barrel is not less than 0.9.

3. A holding system according to claim 1, wherein said barrel is made of ceramics or a low thermal-expansion alloy material.

4. A holding system according to claim 1, further compressing a cooling mechanism for cooling the optical member.

5. A holding system according to claim 4, wherein said cooling mechanism includes a radiation member for cooling the optical member without contact thereto, a Peltier device disposed in contact with said radiation member, and a heat radiating block disposed at a side of said Peltier device remote from said radiation member.

6. A holding system according to claim 5, wherein an average of radiation coefficient of said heat radiating block is not greater than 0.2.

7. An exposure apparatus, comprising:
an optical system having a plurality of optical elements, for directing light from a light source to a member to be exposed; and
a holding system as recited in claim 1, for holding at least one of said plurality of optical elements.

8. A device manufacturing method, comprising the steps of:
exposing a workpiece by projection exposure, by use of an exposure apparatus as recited in claim 7; and
developing the exposed workpiece.

9. An exposure apparatus, comprising:
an optical system including a plurality of optical elements, for directing light from a light source to a member to be exposed;
a barrel for at least partially surrounding the plurality of optical elements;
a film formed on an inside surface of said barrel and including material having a radiation coefficient larger than that of a material of said barrel; and
a cooling mechanism for cooling at least one of the plurality of optical elements, wherein said cooling mechanism includes (i) a radiation member disposed opposed to the least one of the plurality of optical elements without contact thereto, (ii) a Peltier device being in contact, at on end, with the radiation member, for adjusting a temperature of said radiation member, and (iii) a heat radiating block being in contact with the other end of said Peltier device,
wherein an average of radiation coefficient of an inside surface of the barrel is not less than 0.8, and wherein an average of radiation coefficient of the heat radiating block is not greater than 0.2.

10. An apparatus according to claim 9, wherein the average of radiation coefficient of the heat radiating block is not greater than 0.9.

11. An apparatus according to claim 9, wherein the average of radiation coefficient of the heat radiating block is not greater than 0.1.

12. A device manufacturing method, comprising the steps of:
exposing a workpiece by projection exposure, by use of an exposure apparatus as recited in claim 9; and
developing the exposed workpiece.

* * * * *

UNITED STATES PATENT AND TRADEMARK OFFICE
CERTIFICATE OF CORRECTION

PATENT NO. : 7,158,209 B2  Page 1 of 1
APPLICATION NO. : 11/360496
DATED : January 2, 2007
INVENTOR(S) : Shinichi Hara It is certified that error appears in the above-identified patent and that said Letters Patent is hereby corrected as shown below:

In the Specification:

At column 11, Lines 1-2, "compressing" should be --comprising--.

At column 12, Line 18, "heat radiating block" should be --inside surface of the barrel--.

At column 12, Line 19, "greater" should be --less--.

Signed and Sealed this

Second Day of September, 2008

JON W. DUDAS
*Director of the United States Patent and Trademark Office*